United States Patent [19]

Fromont

[11] 4,258,300

[45] Mar. 24, 1981

[54] APPARATUS FOR MEASURING THE FREQUENCY OF A PULSE-GENERATOR AND NUMERICAL CONTROL SYSTEM USING SUCH APPARATUS

[75] Inventor: Jacques L. Fromont, Vanves, France

[73] Assignee: Jeumont-Schneider, Puteaux, France

[21] Appl. No.: 10,114

[22] Filed: Feb. 7, 1979

[30] Foreign Application Priority Data

Mar. 22, 1978 [FR] France ................................ 78 08328

[51] Int. Cl.$^3$ ............................................ H02P 5/16
[52] U.S. Cl. .................................. 318/318; 318/314; 318/341
[58] Field of Search ...................... 318/314, 318, 341; 235/92 CC, 92 DM, 92 FQ, 92 TF; 324/79 D

[56] References Cited

U.S. PATENT DOCUMENTS

| 3,518,540 | 6/1970 | Roberts ............................ 324/79 D |
| 3,609,326 | 9/1971 | Bagley ............................. 324/79 D |
| 3,757,167 | 9/1973 | Yoshikawa ......................... 324/160 |
| 3,859,512 | 1/1975 | Ritzinger ......................... 235/92 TF |
| 3,987,365 | 10/1976 | Okada et al. ..................... 328/133 |
| 4,093,850 | 6/1978 | Karnowski et al. ............ 235/92 TF |

OTHER PUBLICATIONS

Bederman, S. "Computer and Apparatus for Measuring Rotational Speed", *IBM Tech. Disc. Bull.*, vol. 13, No. 4, pp. 1017-1018.

*Primary Examiner*—David Smith, Jr.
*Attorney, Agent, or Firm*—C. M. Lorin

[57] ABSTRACT

The frequency of a pulse generator, which could be the tachometer of a motor, is measured with a fast clock and a slow clock using a computer to calculate the frequency $\omega = k\,N1/N2$, where N2 is a count of pulses accumulated in a register during each period of the slow clock while N1 is the count of the fast clock during the same period. Depending upon whether the measured frequency is higher or lower than the slow clock frequency, a comparator causes measurement to occur at the end of N2 pulses or with N2=1.

9 Claims, 3 Drawing Figures

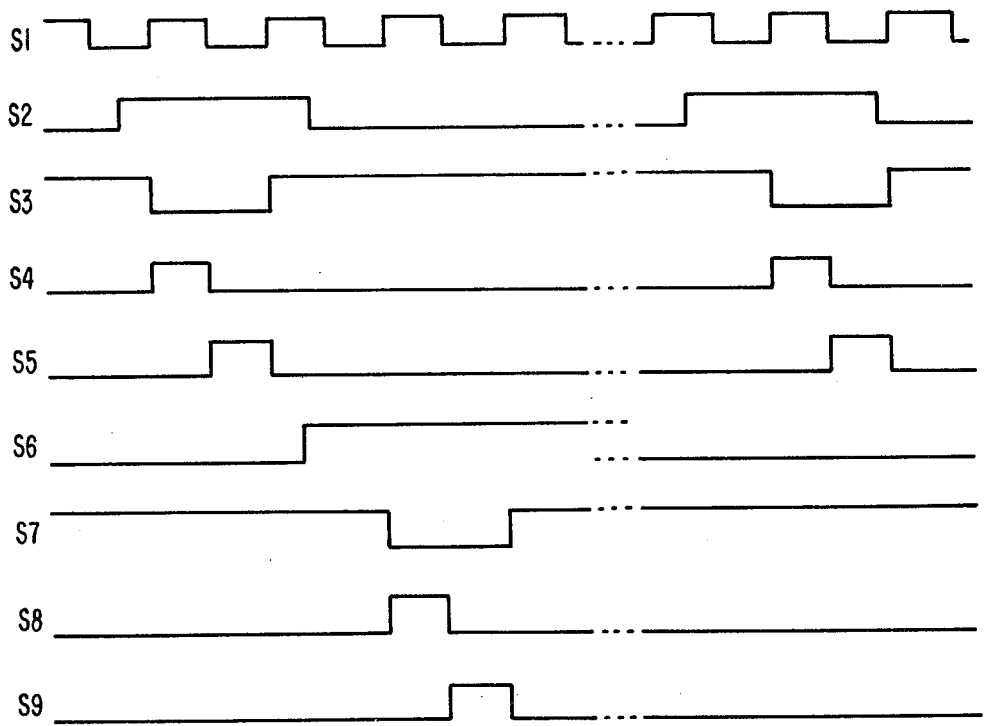
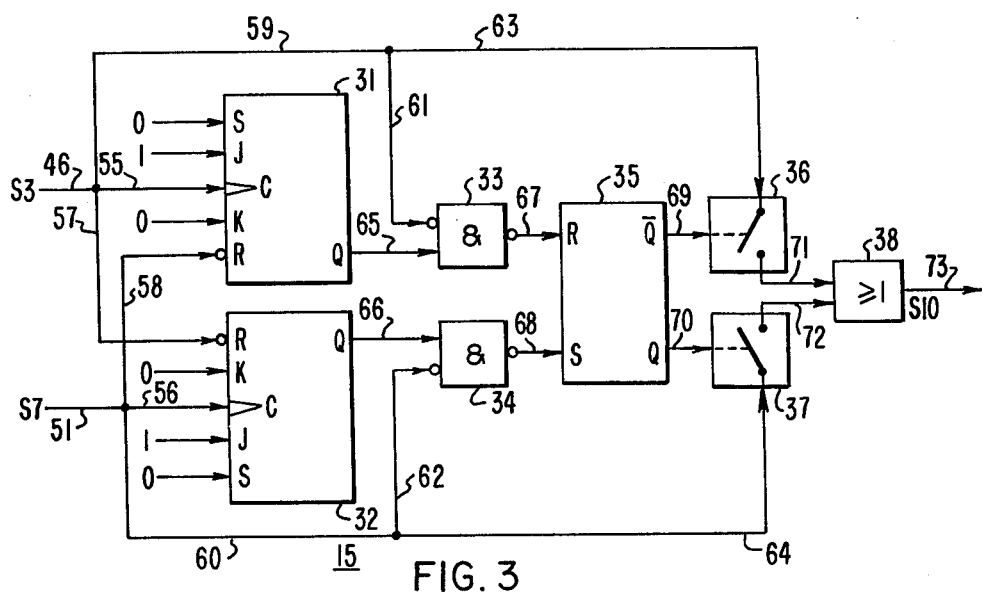
FIG. 2
FIG. 3

APPARATUS FOR MEASURING THE FREQUENCY OF A PULSE-GENERATOR AND NUMERICAL CONTROL SYSTEM USING SUCH APPARATUS

BACKGROUND OF THE INVENTION

The invention relates to apparatus for measuring the pulse rate of a pulse generator. It is applicable as a tachometer to measure the rotational speed of a motor for the purpose of control and regulation thereof. The object of the invention is to provide a precise measurement of such pulse rate or motor speed.

A pulse generator, which forms an integral part of the motor's shaft, or otherwise, which is connected to the shaft, delivers a series of pulses whose frequency is proportional to the rotational speed of the motor. One approach to the determination of the frequency of such pulses in the prior art consists in counting pulses over a given time interval. However, a fast and precise measurement requires an excessively high pulse frequency at maximum speed, whereas the precision tends to decrease with speed and becomes insufficient over a wide range of operation at low speed. Another solution in the prior art to this frequency measuring problem consists in counting the pulses of a fast clock occurring between two consecutive pulses of the pulse generator. Here, again, the precision is variable, since it is inversely proportional to the rotational speed. The requirements are here a very fast clock and a very high count capability.

The object of the present invention is to provide continuous measurement of pulse rates throughout a frequency range extending from very low to relatively high, typically from 8 to 10000 Hz.

Another object of the invention is to be able to measure speed continuously in a range extending down to very low speed.

The prior art has not met the problem of pulse rate measurement at very low frequencies, nor is it known in the prior art how to provide a smooth transition when measuring speed or frequency throughout a very wide range including very low speed or frequency rates.

SUMMARY OF THE INVENTION

The object of the present invention is to improve measurement of the frequency of a pulse generator by providing acquisition time and precision which are constant over a large range of frequencies.

The clock pulses of a fast clock are first counted during each period of the pulses of the pulse generator, then accumulated into a register to provide a count N2 during each period of the clock pulses of a slow clock. The pulses of the pulse generator are likewise counted during the latter period to provide a count N1. At the end of this period, a computer assesses the measurement by computing the pulse rate of the pulse generator, which could be the speed of a motor driving the pulse generator, by calculating $\omega = K$ N1/N2, where K is a proportionality coefficient.

The invention is applicable to control and regulation of the speed of a rolling-mill motor, when the pulse generator is coupled to the motor.

More specifically, a fast clock generates clock signals at a high frequency which are counted by a first counter. A slow clock generates clock signals at a low frequency. A second counter is used to count pulses which indicate the magnitude of frequency, or speed, to be measured. A comparator controls the transfer of the counts in the second counter and in a cumulative register associated with the first counter to a computer, or calculator. The comparator causes such transfer to occur at the end of the larger time interval as between the period of the slow clock signals and the period of pulses to be measured. Concurrently with the transfer, the computer provides the measurement result and resets the second counter, as well as the cumulative register. The use of two clocks allows a frequency measurement normally to be obtained with a constant acquisition time (5 milliseconds) namely for a frequency $f \geq 200$ Hz, and it makes measurement possible at frequencies from 200 Hz. down to 8 Hz, then with a non-constant acquisition time but with a good precision. The comparator automatically selects one approach to measurement, or the other. Thus, manual switching is avoided.

The apparatus, according to the invention, for measuring the frequency of a pulse generator specifically comprises: a fast clock generating clock signals at a high repetition rate; a first counter connected to the fast clock and to the pulse generator for counting clock signals delivered by the fast clock between successive pulses of the pulse generator; a cumulative register; means for transferring and adding the contents of the first counter to the contents of the cumulative register while resetting the first counter to zero at the end of each period of the pulse generator; a slow clock for generating clock signals at a low frequency rate; a second counter responsive to the pulse generator and to the slow clock for counting pulses from the pulse generator between successive clock signals of the slow clock; computer means for calculating the ratio between the count in the second counter and the count in the cumulative register, thereby providing the intended measurement; and comparator means for comparing the period of the pulses from the pulse generator and the period of the slow clock. At the end of the greater of these two periods, the computer means causes transfer of the counts from the second counter and from the cumulative register into the computer means, and initiates the calculation of the ratio, while triggering the reset of the second counter and of the cumulative register.

BRIEF DESCRIPTION OF THE DRAWINGS

FIG. 2 shows curves illustrating the signals derived at various locations in the apparatus circuits; and FIG. 3 illustratively shows a comparator as can be used in the apparatus of FIG. 1.

DESCRIPTION OF THE PREFERRED EMBODIMENTS

Figure 1:
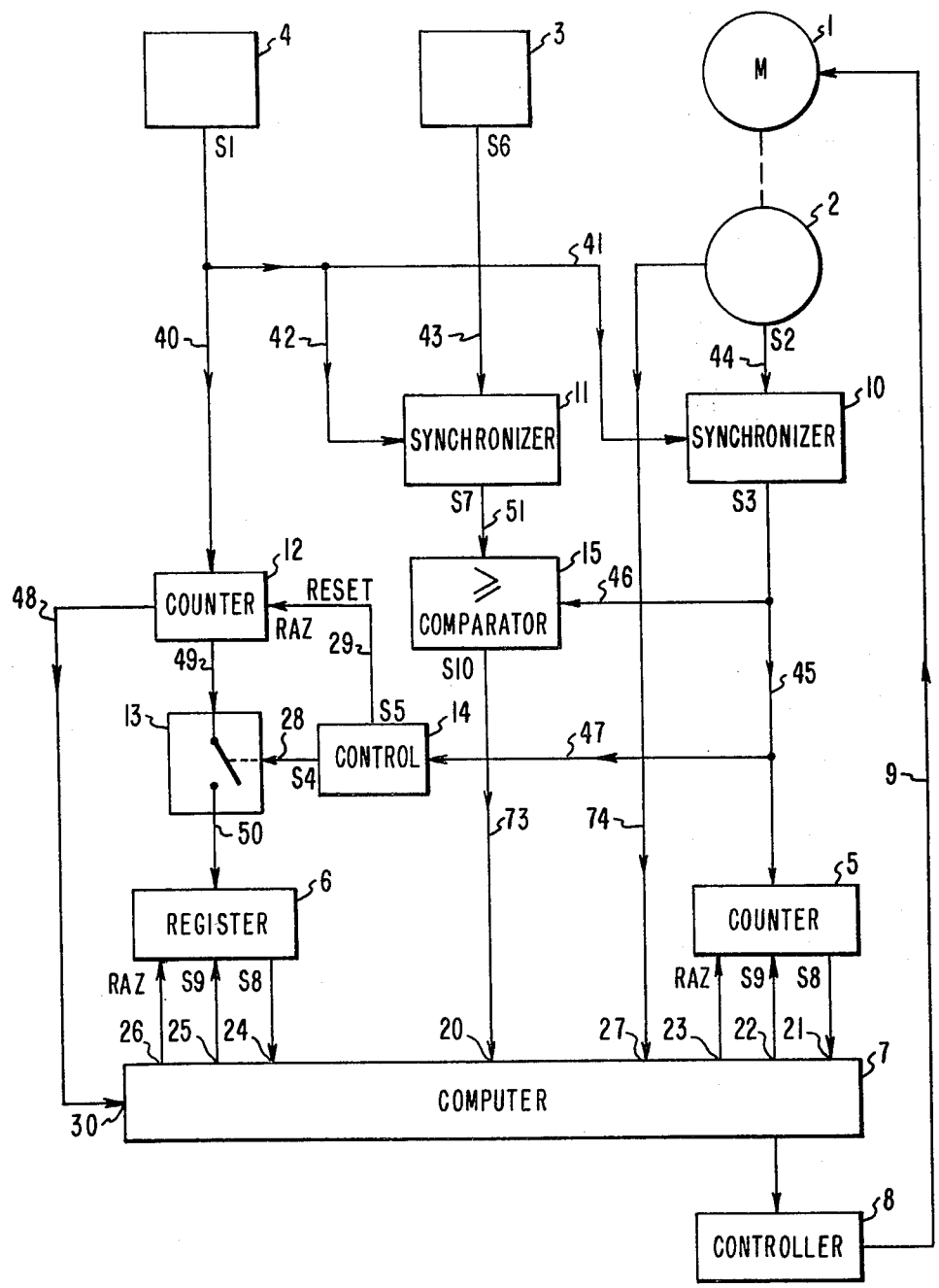
FIG. 1 is a block diagram of the apparatus according to the invention.

FIG. 1 shows the general block diagram of the speed measuring apparatus for a motor 1 whose shaft is mechanically coupled to a pulse generator 2. The pulse generator 2 consists, for example, of an optical detector, a magnetic pickup or a Hall effect device which senses the passage of an element attached to, or forming part of, the motor shaft. The pulse generator produces on line 44 a signal in the form of one or more pulses during each rotation of the motor. The repetition frequency of these pulses lies, for example, between 8 Hz and 10 kHz. The pulses from pulse generator 2 are counted by a counter 5 during each repetition period of a slow clock 3. The frequency of clock 3 is, for example, 200 Hz. A fast clock 4 serves, on the one hand, to synchronize (via lines 41, 42 to respective synchronizers 10, 11) the unit and, on the other hand, to deliver fast clock signals (via line 40) at a frequency, for example, of 1 mHz. The fast clock signals from the fast clock 4 are counted during each repetition period of pulse generator 2. At the end of a period of the slow clock 3, a number of pulses N1 (via line 44, synchronizer 10 and line 45) from the pulse generator 2 is available in a counter 5 and a total number N2 of fast clock signals (via line 40), produced by the fast clock 4 (supplied via line 40 to counter 12, transferred via line 49, gate 13 and line 50) and counted during this period, has become available in cumulative register 6.

A computer 7 reads (at input 21) the contents of counter 5 and (at input 24) the contents of register 6, then resets (from negative outputs 23 and 26) the counts to zero and computes the value of the speed $\omega = K\, N1/N2$, where K is a proportionality constant. The magnitude of the speed $\omega$ outputted by computer 7 may be used as a measure of speed and, later either displayed or taken as a parameter in a speed control loop, such as shown by control and display circuit 8 and control line 9 from circuit 8 to motor 1.

The fast clock 4 delivers a square wave signal having a period of 1 microsecond. To synchronize the system and ensure a coincidence of signals as necessary for an effective operation of the apparatus, the pulse generator 2 is connected via line 44 to a synchronizer 10. Synchronizer 10 delivers (on line 45) a duration-calibrated pulse upon each pulse from generator 2. The calibrated pulse is coextensive with the first whole period of the fast clock signal (on line 41) following the leading edge of the pulse (on line 44) from generator 2. Similarly, the slow clock 3 is connected via line 43 to a synchronizer 11 which is of the same nature as synchronizer 10. Synchronizer 11 is also responsive to the fast clock signal from the fast clock 4 via line 42.

Synchronizer 10 is connected by line 45 to counter 5 whose contents are automatically increased by one unit with each new pulse received. The clock signals from the fast clock 4 are first applied via line 40 to a counter 12, which is similar to counter 5. The count in counter 12 is transferred by a switch 13 into a cumulative register 6. Switch 13 consists, for example, of a gate circuit. A control and transfer circuit 14 upon receiving on line 47 a pulse from synchronizer 10 generates on lines 28 and 29 two respective control signals which are shifted with respect to time. The first control signal applied via line 28 causes the transfer of the count in counter 12 into cumulative register 6 via gate 13, e.g., by adding to the count in register 6 the count in counter 12, to form a new total count in register 6. The second control signal transmitted via line 29, causes counter 12 to be reset to zero. These two control signals appear during one and the same period of the fast clock 4 so that no count is lost.

At the end of a counting period, a command signal is applied via line 73 to the input 20 of computer 7. The computer reads (from inputs 21 and 24) the counts in counter 5 and in register 6, then calculates the value $\omega$ of the angular speed of the motor associated with the pulse generator 2.

As long as the period of the slow clock 3 is longer than the period between pulses of generator 2, the command signal applied to the input 20 of computer 7 is in response to the pulses of synchronizer 11. If the period between the pulses of generator 2 becomes greater than the period of the slow clock 3, the command signal is in response to the pulses of generator 10. In order to avoid being limited in the range of speed measurement by the lower frequencies, the apparatus according to the present invention includes a period comparator circuit 15 which, on the one hand, receives the pulses from synchronizer 10 and, on the other hand, those from synchronizer 11. From such comparison is derived a command signal which is applied on line 73 to terminal 20 of computer 7. This command signal is coincident with the one of the possible input pulses which has the longer period. When receiving the command signal, computer 7 reads the contents N1 and N2 of counter 5 and register 6, then resets them to zero.

Computer 7 typically includes a microprocessor with a programmable "read only" memory and an active memory. The program is such that the computer effects, in succession, a reading of the values of N1 and N2, a return to zero of counter 5 and register 6, the calculation of the value of $\omega$ and, if need be, the calculation of the input signal for the control circuit 8. As far as the computer is concerned, counter 5 and register 6 may be regarded as peripheral memories. Computer 7 is provided with an input terminal 21 for the value N1 from counter 5, an output terminal 22 to command a reading of the value of N1 and a command terminal 23 to command the reset of counter 5. In addition, the computer is provided with an input 24 for reading the contents N1 of register 6, an output 25 to command reading of the value N2 in this register, and an output 26 for the reset command. The computer is also provided with an input 27 supplied via line 74 from the pulse generator 2 to indicate the direction of the motor, e.g., to determine the sign, positive or negative, of the computed value of $\omega$. Finally, the computer is provided with an input 30 supplied via line 48 with the carry-over output of counter 12. This carry-over indicates an overflow of counter 12, which only occurs when the motor is stopped or is running very slowly (frequency of impulse generation less than 8 Hz). When such situation is detected, the signal at the input 30 cause the value $\omega = 0$ to appear at the output of the computer.

FIG. 2 illustrates the signals at various points in the apparatus. These points are identified by references S1 to S10 in FIG. 1. The signals in FIG. 2 are given like references. Thus, the apparatus is driven by a fast clock having a frequency of 1 mHz whose square wave clock signals are represented by S1 (FIG. 2). S2 is the signal outputted by the pulse generator 2 which is mechanically coupled to the motor 1. Signal S2 consists in pulses having any arbitrary width at any given time and these pulses are not synchronized with respect to clock 4. The synchronized pulse synchronizer 10 by synchronization causes pulses represented by S3 to be outputted which, as shown, are coextensive with the entire period of signal S1 following the front edge transition of signal S2. The pulse signal S3 is applied to the control circuit 14. Circuit 14 supplies a first control signal S4 controlling the transfer of the contents from counter 12 into register 6 and a second control signal S5 which is phase-shifted in relation to S4. Control signal S5 resets counter 12 to zero. S6 is the clock signal from the slow clock 3. S7 represents the output signal from the synchronized impulse generator 11. Signal S7 brings about the synchronization of the slow clock 3 with the fast clock 4. Like S3 signal, S7 is a pulse whose duration is equal to the period of the fast clock and which is coextensive with the period of the clock following the front edge of signal S6. If it is assumed that the frequency of the pulses from generator 2 is greater than that of the slow clock, the command signal applied to terminal 20 of the computer will be in line with signal S7. In such case, the computer sends to counter 5 and register 6, a pulse S8 to command a reading of the values N1 and N2, and then sends a pulse S9 to reset these values to zero. Pulse S9 has a phase-shift with respect to S8.

Control of computer 7 depends upon the operation of period comparator circuit 15, shown separately in FIG. 3. Comparator 15 effectuates a comparison between the periods of the pulses S3 at the output of generator 10 and the pulses S7 at the output of generator 11. Comparator 15 consists of two JK flip-flops 31 and 32 whose dynamic inputs C respectively receive via lines 51 and 56 the signals S3 and S7. The J inputs of flip-flops 31 and 32 are permanently connected to the logic level 1. The S and K inputs of flip-flops 31, 32 are permanently connected to the logic 0. In addition, flip-flop 31 is provided with an inverted reset input R connected via line 58 to the dynamic input C of flip-flop 32. Similarly, flip-flop 32 includes an inverted reset input R connected via line 57 to the input C of flip-flop 31. With such arrangement, the output Q of one or other of flip-flops 31 and 32 goes to a logic state 1 upon each front edge transition of the pulse applied to the C dynamic input, and resets to the logic state 0 upon the trailing edge transition of the pulse applied to the dynamic input of the other flip-flop. A NAND circuit 33 is provided with an inverted input connected via line 65 to the Q output of flip-flop 31, and an inverted input connected via lines 59 and 61 to receive signal S3. Similarly, a NAND circuit 34 is provided with a non-inverted input connected via line 66 to the Q output of flip-flop 32 and an inverted input connected via lines 60, 62 to receive signal S7. An RS flip-flop 35 has its inputs respectively connected via lines 67, 68 to the outputs of the NAND circuits 33 and 34. The outputs $\bar{Q}$ and Q of flip-flop 35 respectively control via lines 69, 70 switches 36 and 37. One terminal of switch 36 directly receives via lines 59, 63 signal S3, the other terminal being inputted via line 71 into an OR circuit 38. Similarly, one terminal of switch 37 receives by lines 60, 64 signal S7, the other terminal being inputted by line 72 into a second input of OR circuit 38. The OR circuit 38 provides on line 73 the command signal triggering calculations by the computer 7. This command signal is either signal S3 or signal S7.

Comparator 15, ensures that the value of the contents of counter 5 can never be less than unity.

If the period of the pulses from generator 2 is larger than the period of the clock signal from the slow clock 3, computer 7 receives an indication of a value N1=1, and of a value N2, which is proportional to the duration of this period. While computing the quantity ω, pulses from the fast clock 4 are being counted by counter 12. This count will be taken into account by the following computation. Thus, no pulse is lost.

If the period of the pulses from generator 2 is less than the period of the slow clock 3, it will be the clock signal from the slow clock which triggers computer 7. Counter 5 counts a number N1 of successive full periods of the pulse generator 2 while register 6 adds a number N2 of pulses received from the fast clock 4 and accumulated during the course of these successive periods of pulse generator 2. Should a command signal occur between two successive pulses of pulse generator 2, the clock signal from the fast clock 4 accumulates counts in counter 12 which will be used in the subsequent computing cycle. Thus, no pulse is lost in the computation.

The measuring apparatus according to the present invention affords the following advantages: The acquisition time for the information is constant and equal to 5 ms, as long as the pulses from the pulse generator 2 have a period less than the period of the slow clock 3. This acquisition time is sufficient to enable the computer 7 to carry out its functions. When the frequency of the pulses from pulse generator 2 is below 200 Hz, indeed, the acquisition time is long but the effectiveness of the measuring apparatus according to the invention is not limited in the low frequency range. The resolution in measurement does not vary much through the useful range of the apparatus. Finally, the precision in measurement depends upon the speed of the fast clock 4.

Moreover, the measuring apparatus according to the present invention provides an indication of zero speed when counter 12 reaches its maximum value. An indication of overspeeding is available when there is overflow of counter 5 receiving the pulses from pulse generator 2.

The invention is applicable to speed control for electric motors and is, more particularly with regard to motors of rolling mills. Freedom from noise, which is inherent in numerical techniques, makes the present invention attractive for use in an industrial environment.

I claim:

1. In an apparatus for measuring the frequency of a series of pulses derived from a pulse generator, the apparatus including a fast clock for generating a fast clock signal, first counter means for counting the pulses from said generator, and second counter means for counting said fast clock signal during successive periods of said pulses; the combination of:
    a slow clock providing a slow clock signal;
    register means for accumulating counts from said second counter means;
    means responsive to said pulses for transferring the contents of said second counter means into said register means and for resetting said second counter means;
    comparator means responsive to said slow clock signal and to said series of pulses for establishing a measuring time interval representing the larger of the period of said clock signal and the period of said pulses; and
    means responsive to said time interval for initiating operation of said first counter means and said register means, for deriving at the end of said time interval a count N1 from said first counter means and a count N2 from said register means, and for computing with the derived counts N1 and N2 the ratio N1/N2 as a measure of the frequency of said pulses.

2. The apparatus of claim 1 with said comparator means outputting a command signal in relation to the one of said pulses and slow clock signal having the longer period and applying said command signal to said initiating means; with said command signal applying N1=1 to said initiating means when said command signal relates to said slow clock signal.

3. The apparatus of claim 2 in which said comparator means includes a first input responsive to said pulses and a second input responsive to said slow clock signal;
    two JK flip-flops each having the J input connected to the logic one, a C input connected to a different one of said first and second inputs, an R input connected to the C input of the other JK flip-flop, and a Q output;

two NAND devices each having a non-inverted input and an inverted input respectively connected to the Q output and the C input of a corresponding one of said flip-flops;

an RS flip-flop having an R input and an S input connected respectively to the output of said NAND devices for providing a Q and a $\bar{Q}$ output, two gate devices controlled by said inputs, respectively, to pass a corresponding one of said Q and $\bar{Q}$ outputs, and an OR device responsive to the respective said gate devices to deliver said command signal in relation to the one of said pulses and slow clock signal having the larger period.

4. The apparatus of claim 1 with means responsive to said fast clock signal for synchronizing therewith said pulses and said slow clock signal.

5. The apparatus of claim 1 with said initiating means resetting said first counter means and said register means following response to said command signal.

6. The apparatus of claim 1 with said computing means outputting a speed zero indication when in the low speed range of the motor the capacity of said second counter means is exceeded between two successive said pulses.

7. A method of measuring a frequency which is variable between substantially zero and a predetermined maximum frequency, comprising the steps of:

deriving a first series of pulses having a period which is characteristic of the frequency to be measured;

deriving a fast clock signal having a frequency which is substantially higher than said maximum frequency;

deriving a slow clock signal having a frequency which is lower than said maximum frequency;

counting N2 pulses of said fast clock signal and N1 pulses of said first series of pulses during a time interval equal to the larger one of the period of said slow clock signal and the period of said series of pulses; and computing the ratio N1/N2 as an indication of the measured frequency.

8. The method of claim 7 with said pulses of said first series of pulses and said slow clock signal being synchronized by said fast clock signal whereby said time interval is initiated in synchronism with said fast clock signal.

9. The method of claim 8 with said N2 and N1 counting steps being accompanied at the end of said time interval with the step of setting N1 to one when the period of the slow clock signal is smaller than the period of said series of pulses.

* * * * *